(12) United States Patent
Lin

(10) Patent No.: US 6,728,137 B1
(45) Date of Patent: Apr. 27, 2004

(54) METHOD FOR PROGRAMMING AND READING A PLURALITY OF ONE-TIME PROGRAMMABLE MEMORY BLOCKS

(75) Inventor: Ching-Yuan Lin, Hsin-Chu Hsien (TW)

(73) Assignee: eMemory Technology Inc., Hsin-Chu (TW)

( * ) Notice: Subject to any disclaimer, the term of this patent is extended or adjusted under 35 U.S.C. 154(b) by 0 days.

(21) Appl. No.: 10/249,680

(22) Filed: Apr. 29, 2003

(51) Int. Cl.[7] .............................................. G11C 16/04
(52) U.S. Cl. .............................. 365/185.05; 365/185.11
(58) Field of Search ....................... 365/185.01, 185.04, 365/185.09, 185.11, 185.33, 230.03

(56) References Cited

U.S. PATENT DOCUMENTS

| | | | | |
|---|---|---|---|---|
| 5,642,316 A | * | 6/1997 | Tran et al. | ............. 365/185.09 |
| 5,675,547 A | * | 10/1997 | Koga | ..................... 365/203.03 |
| 6,160,734 A | * | 12/2000 | Henderson et al. | .... 365/185.04 |
| 6,222,760 B1 | * | 4/2001 | Chang | .................... 365/185.01 |
| 6,226,199 B1 | * | 5/2001 | Ichikawa | ............... 365/185.04 |

* cited by examiner

Primary Examiner—Trong Phan
(74) Attorney, Agent, or Firm—Winston Hsu

(57) ABSTRACT

A method for controlling programming and reading operations of a plurality of one-time programmable (OTP) memory blocks includes (a) selecting an un-programmed OTP memory block from the OTP memory blocks according to status of the OTP memory blocks recorded In a memory element, (b) programming the selected OTP memory block, and (c) updating the status of the OTP memory blocks recorded in the memory element so as to record that the selected OTP memory block is programmed.

9 Claims, 6 Drawing Sheets

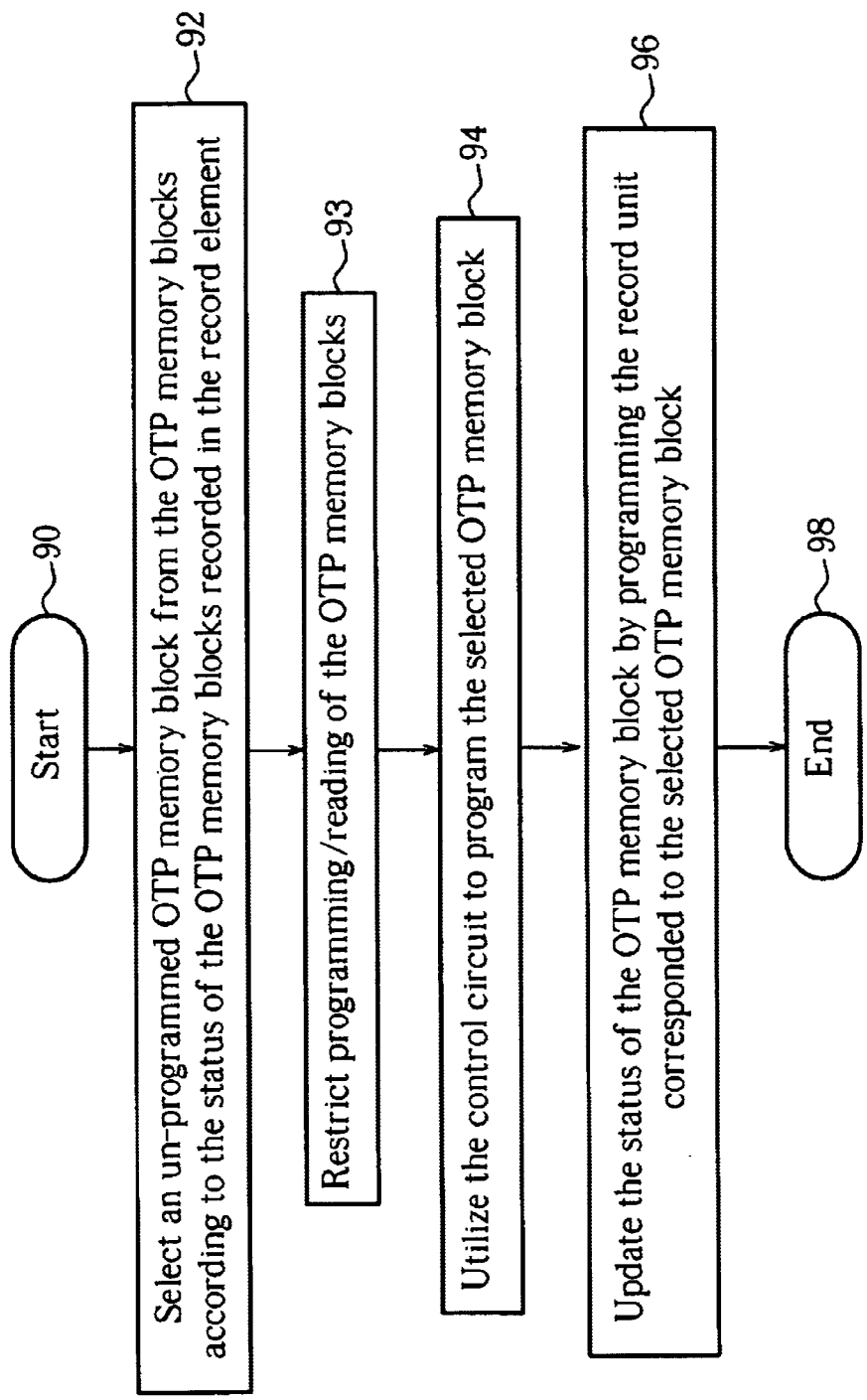

METHOD FOR PROGRAMMING AND READING A PLURALITY OF ONE-TIME PROGRAMMABLE MEMORY BLOCKS

BACKGROUND OF INVENTION

1. Field of the Invention

The present invention relates to a method for controlling, programming, and reading operations of a memory device, and more particularly, to a method for programming and reading a plurality of one-time programmable (OTP) memory blocks so as to simulate updateable ability as a multi-time programmable (MTP) memory.

2. Description of the Prior Art

Because of the non-volatile characteristic of non-volatile memory, non-volatile memory has been applied in various electrical products, such as digital cameras, mobile phones, video game consoles, and personal digital assistants. Generally speaking, some memory devices, such as hard disk drives, flash memory, and one-time programmable (OTP) memory, can be classified as non-volatile memories because data stored in these devices is not lost when power is shutdown. Flash memory and OTP memory are two kinds of non-volatile memory that are more popular. Flash memory and OTP memory respectively control a threshold voltage of their memory cells to store binary data such as "0" or "1". The main difference between flash memory and OTP memory is that data stored in flash memory can be updated and OTP memory is one-time programmable. Once data Is written into a memory cell of OTP memory, it is impossible to update the data stored in the memory cell.

Please refer to FIG. 1, which is a structure diagram of a flash memory cell 10. The flash memory cell 10 comprises a substrate 12, a source 14, a drain 16, a floating gate 18, and a control gate 20. The control gate 20, source 14, and drain 16 have voltages Vcg, Vs, and Vd respectively. An oxide layer 24 is formed between a channel 22 and the floating gate 18. The substrate 12 is connected to a reference voltage (normally 0V). If the substrate 12 is P-doped, then the source 14 and the drain 16 are both N-doped. If the substrate 12 is N-doped, then the source 14 and the drain 16 are both P-doped. Data stored in the flash memory cell 10 is determined by electrons stored in the floating gate 18 because the electrons stored in the floating gate 18 will change the corresponding threshold voltage of the flash memory cell 10. A lower threshold voltage of the flash memory cell 10 corresponds to fewer electrons in the floating gate 18 and corresponds to a binary number"1". And a higher threshold voltage of the flash memory cell 10 corresponds to more electrons in the floating gate 18 and corresponds to a binary number"0".

Before writing data into the flash memory cell 10, the flash memory cell 10 must be erased. Currently, the most well-known and commonly used flash memory erasing method is called Fowler-Nordheim tunneling (FN tunneling). FN tunneling is mentioned in many documents, such as U.S. Pat. No. 5,642,311 "Overerase correction for flash memory which limits overerase and prevents erase verify errors". When an erasing procedure Is performed on the flash memory cell 10, a voltage pulse is continually applied to the flash memory cell 10. The erasing voltage pulse generates an electromotive force (EMF) with a negative potential difference between the control gate 20 and the drain 16 of the flash memory cell 10. For example, when an erasing voltage pulse is applied to the flash memory cell 10, the voltage of the control gate 20 is 10 volts, and the voltage of the source 14 is +5.5 volts. With the above erasing procedure, electrons accumulated in the floating gate 18 of the flash memory cell 10 are reduced because the electrons pass through a thin dielectric layer of the flash memory cell 10 to cause a reduction of the threshold voltage of the flash memory cell 10.

Because flash memory Is updateable, flash memory can be classified as multi-time programmable (MTP) memory. In order to operate properly, MTP memory must comprise specific circuits for erasing, programming, and reading operations. Unlike MTP memory, OTP memory comprises circuits for programming and reading operations without comprising erasing circuit, so the circuit for controlling the operations of OTP memory is simpler than the circuit for controlling the operations of MTP memory. In addition, the manufacturing processes of MTP memory are more complex than the manufacturing processes of OTP memory, so MTP memory usually has higher cost than OTP memory. Moreover, OTP memory is one-time programmable so that the usage of OTP, memory is limited.

SUMMARY OF INVENTION

It is therefore a primary objective of the claimed invention to provide a method for controlling reading and programming operations of a plurality of OTP memory blocks of a memory device to simulate the updateable ability of MTP memory.

The memory device comprises a plurality of one-time programmable (OTP) memory blocks, a record element for recording status of the OTP memory blocks, and a control circuit electrically connected to the OTP memory blocks for controlling programming and reading operations of the OTP memory blocks. Each of the OTP memory blocks comprises a plurality of OTP memory cells. Each of the OTP memory cells is used to store one bit data.

The method comprises (a) selecting an un-programmed OTP memory block from the OTP memory blocks according to the status of the OTP memory blocks recorded in the memory element; (b) programming the selected OTP memory block; and (c) updating the status of the OTP memory blocks recorded in the memory element so as to record that the selected OTP memory block is programmed.

These and other objectives and advantages of the present invention will no doubt become obvious to those of ordinary skill in the art after reading the following detailed description of the preferred embodiment that is illustrated in the various figures and drawings.

BRIEF DESCRIPTION OF DRAWINGS

FIG. 6 is a flow chart of programming operations of the memory device according to another embodiment of the present invention.

DETAILED DESCRIPTION

Figure 1:
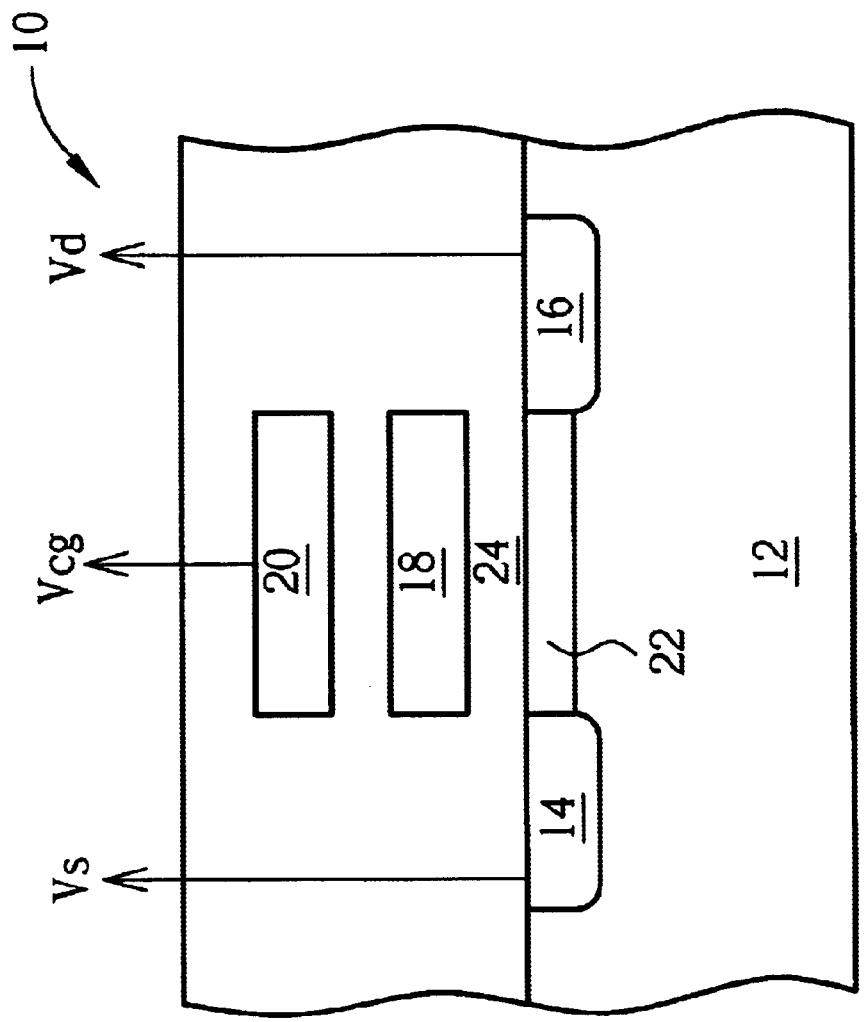
FIG. 1 is a structure diagram of a flash memory cell.
Figure 2:
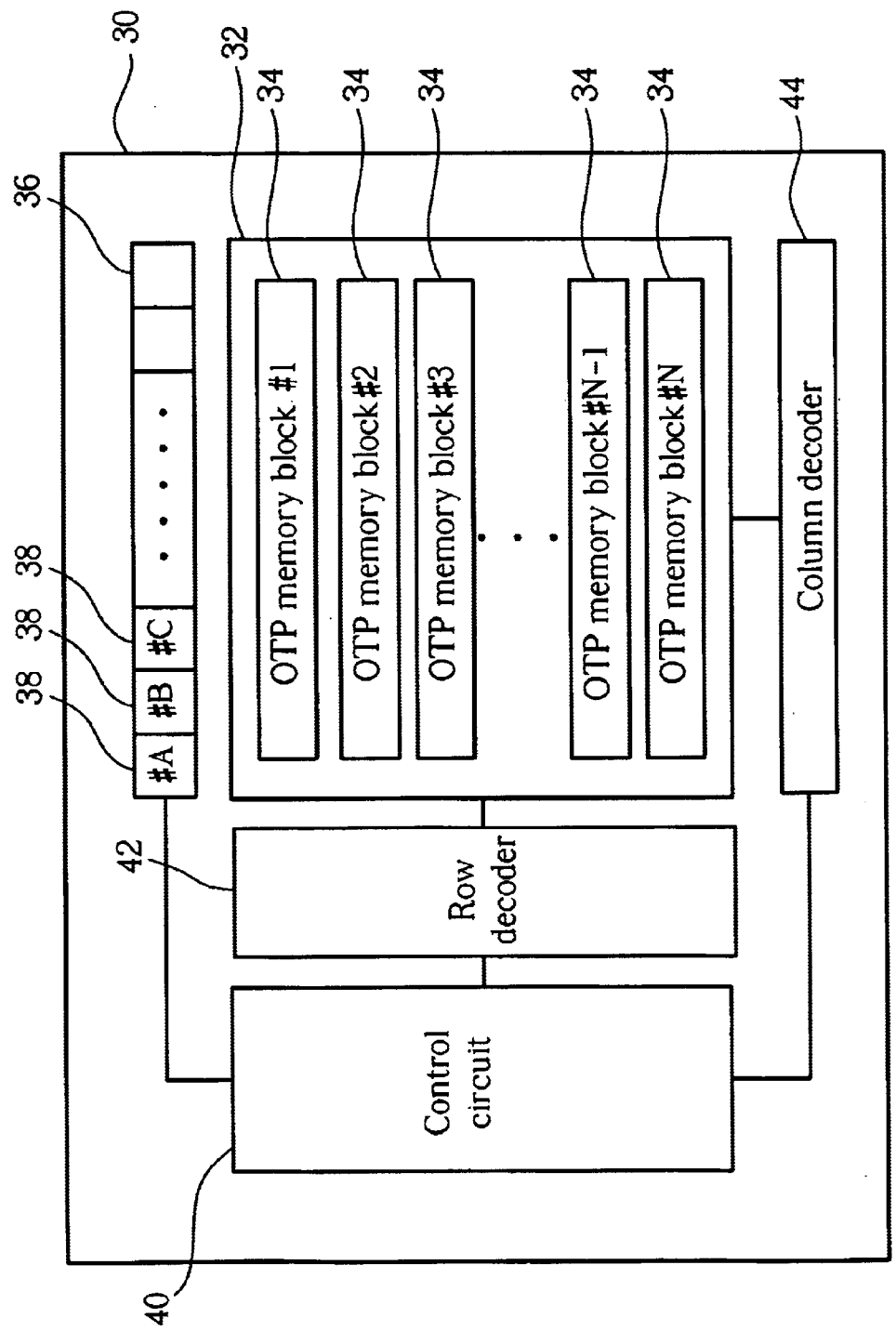
FIG. 2 is a functional block diagram of a memory device according to the present invention.
Figure 3:
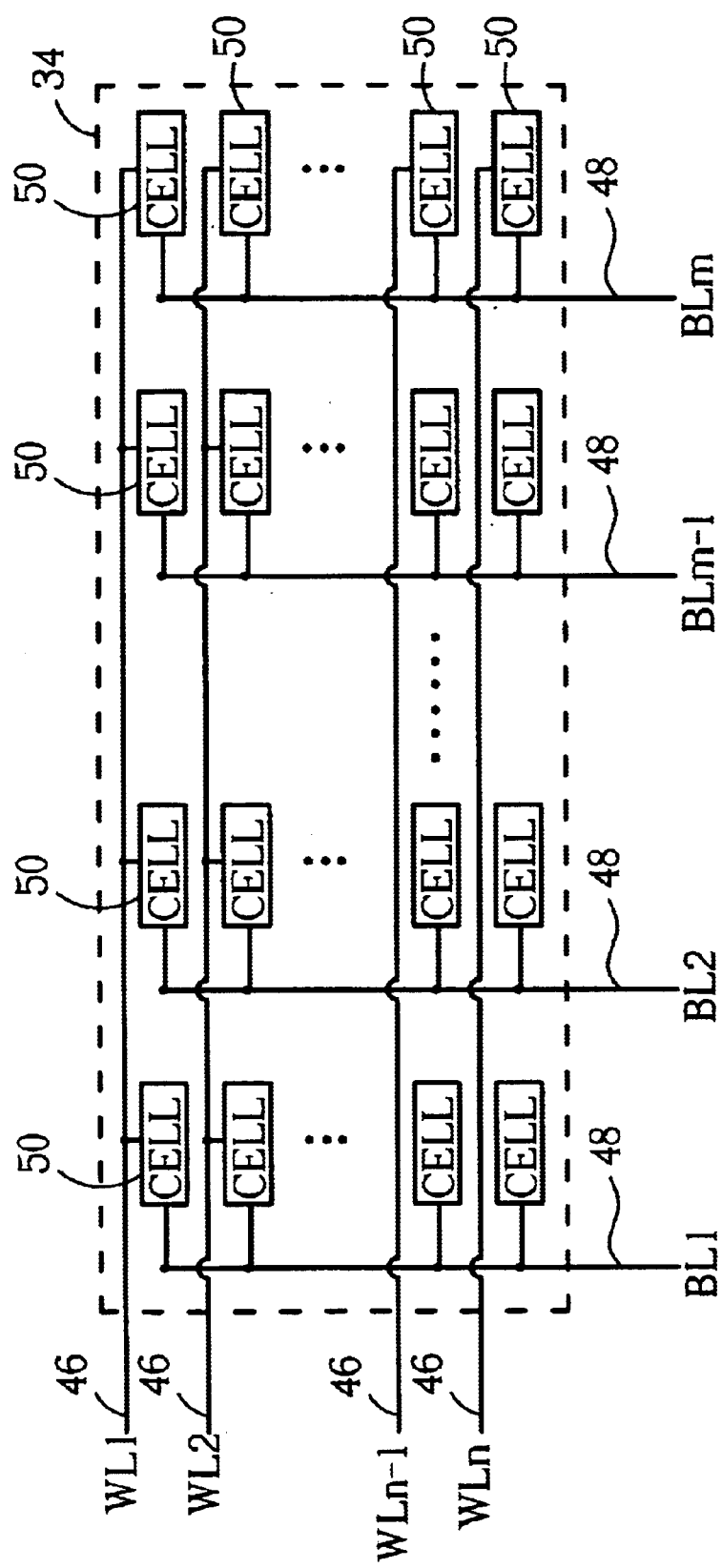
FIG. 3 is a circuit diagram of an OTP memory block of the memory device shown in FIG. 2.

Please refer to FIG. 2 and FIG. 3. FIG. 2 is a functional block diagram of a memory device 30 adopting the method of the present invention. FIG. 3 is a circuit diagram of an OTP memory block 34 shown in FIG. 2. In this embodiment, the memory device 30 is manufactured by processing OTP manufacturing procedures, so all elements of the memory device 30 are formed in a single chip die. The memory device 30 comprises an OTP memory area 32, a record element 36, a control circuit 40, a row decoder 42, and a column decoder 44. The OTP memory area 32 comprises a plurality of OTP memory blocks 34. Each of the OTP memory blocks 34 comprises a plurality of OTP memory cells 50 that each is used to store one bit data. Because the OTP memory cells 50 are one-time programmable, data cannot be written into the OTP memory cells 50 that have been programmed. The record element 36 is formed with an OTP memory structure and comprises a plurality of record units 38. Each of the record units 38 is composed of one or more of the OTP memory cell 50 and corresponds to one of the OTP memory blocks 34 for recording status of the corresponding OTP memory block 34. For example, the record unit #A records the status of the OTP memory block #1, and the record unit #B records the status of the OTP memory block #2. In the embodiment, if the record unit 38 stores data as "0", it means that the status of the corresponding OTP memory block 34 is un-programmed. If the record unit 38 stores data as "1", it means that the status of the corresponding OTP memory block 34 is programmed. It is noted that the method for recording the status of the OTP memory blocks 34 by using the record units 38 should not be construed as limiting the present invention. Other methods for distinguishing the status of the OTP memory block 34 are acceptable. According to the previous description, it is obvious that the record element 36 and the OTP memory blocks 34 have a lowest common unit, i.e. an OTP memory cell 50. Therefore, the OTP memory area 32 and the record element 36 can be manufactured according to the same OTP manufacturing processes.

The control circuit 40 is electrically connected to the OTP memory blocks 34, the record element 36, the row decoder 42, and the column decoder 44. The control circuit 40 controls the programming and reading operations of the OTP memory blocks 34. The row decoder 42 is electrically connected to the OTP memory cells 50 via a plurality of word lines 46, and the column decoder 44 is electrically connected to the OTP memory cells via a plurality of bit lines 48. In FIG. 3, the word lines 46 and bit lines 48 are respectively individually identified as WL1-WLn (indexed by n) and BL1-BLm (indexed by m). Therefore, the control circuit 40 can control the potentials of the word lines 46 and the bit lines 48 via the row decoder 42 and the column decoder 44 so as to select specific OTP memory cells to program or read.

It is noted that each of the OTP memory blocks is one-time programmable, it cannot be programmed more than one time. However, the primary object of the present invention is to use the OTP memory structure to provide updateable ability such as MTP memory. Therefore, the operation of programming and reading of the memory device 30 should be properly controlled. Please refer to FIG. 4, which is a flow chart of programming operations of the memory device 30 according to the present invention. When the programming operations of the memory device 30 is processing (step 60), the control circuit 40 selects an un-programmed OTP memory block 34 from the OTP memory blocks 34 according to the status of the OTP memory blocks 34 recorded in the record element 36 (step 62). For example, when the memory device 30 is used to store data at the first time, the control circuit 40 selects the OTP memory block #1 to program according to the status of the OTP memory block #1 recorded in the record element 36. After the control circuit 40 selects the target OTP memory blocks 34, the control circuit 40 programs the selected OTP memory block 34 via the row decoder 42 and the column decoder 44 (step 64). After the control circuit 40 programs the selected OTP memory block 34, the control circuit 40 updates the status of the OTP memory blocks 34 recorded in the record element 36 so as to record that the selected OTP memory block 34 is programmed (step 66). For example, after the OTP memory block #1 is programmed, the corresponding record unit #A is programmed so that the data stored in the record unit #A is changed from "0" to "1". Finally, the programming procedure of the memory device 30 is terminated (step 68).

The control circuit 40 restricts the OTP memory blocks 34 such that only one of the OTP memory blocks 34 is readable or programmable at one time. It means that during the programming or reading operations of the selected OTP memory block 34, the control circuit 40 disables other un-selected OTP memory blocks 34 so that the un-selected OTP memory blocks 34 are neither readable nor programmable. This makes only one of the OTP memory blocks in use at one time and reduces the possibility of occurrence of errors.

In some conditions, users hope that the memory device 30 is updateable. However, as previously mentioned, the OTP memory blocks 34 are one-time programmable such that data cannot be written into the programmed OTP memory cells 50. However, when update data is written into the OTP memory area 32, the control circuit 40 disables the current OTP memory block 34 and processes the procedures in FIG. 4, i.e. steps 60–68, again to select another un-programmed OTP memory block 34 to program so as to record the update data. After the programming operations are finished, the control circuit 40 enables the reselected OTP memory block 34 such that the reselected OTP memory block is readable. Therefore; the method of the present invention makes it possible to simulate the updateable ability of MTP memory by using OTP memory structure. For instance, the control circuit 40 can disable the OTP memory block #1 and enable the OTP memory block #2 to record the update data so that It seems that the memory device 30 is updateable like MTP memory. In addition, the more OTP memory block 34 the memory device 30 has, the greater amount of the times to update the data stored in the OTP memory area 34. The memory device 30 can be updated by processing the programming procedures, i.e. steps 60–68, until all of the OTP memory blocks 34 are programmed.

Figure 4:
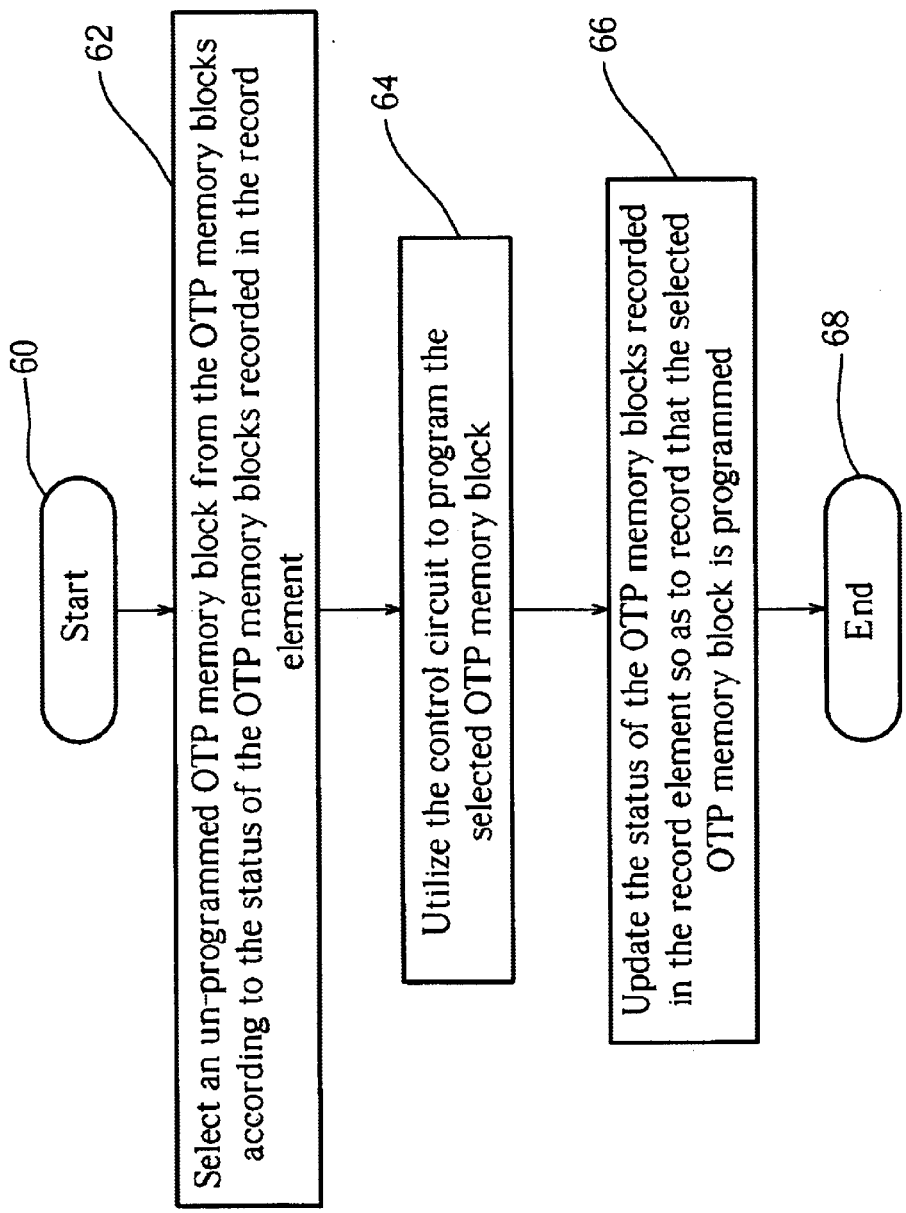
FIG. 4 is a flow chart of programming operations of the memory device according to the present invention.
Figure 5:
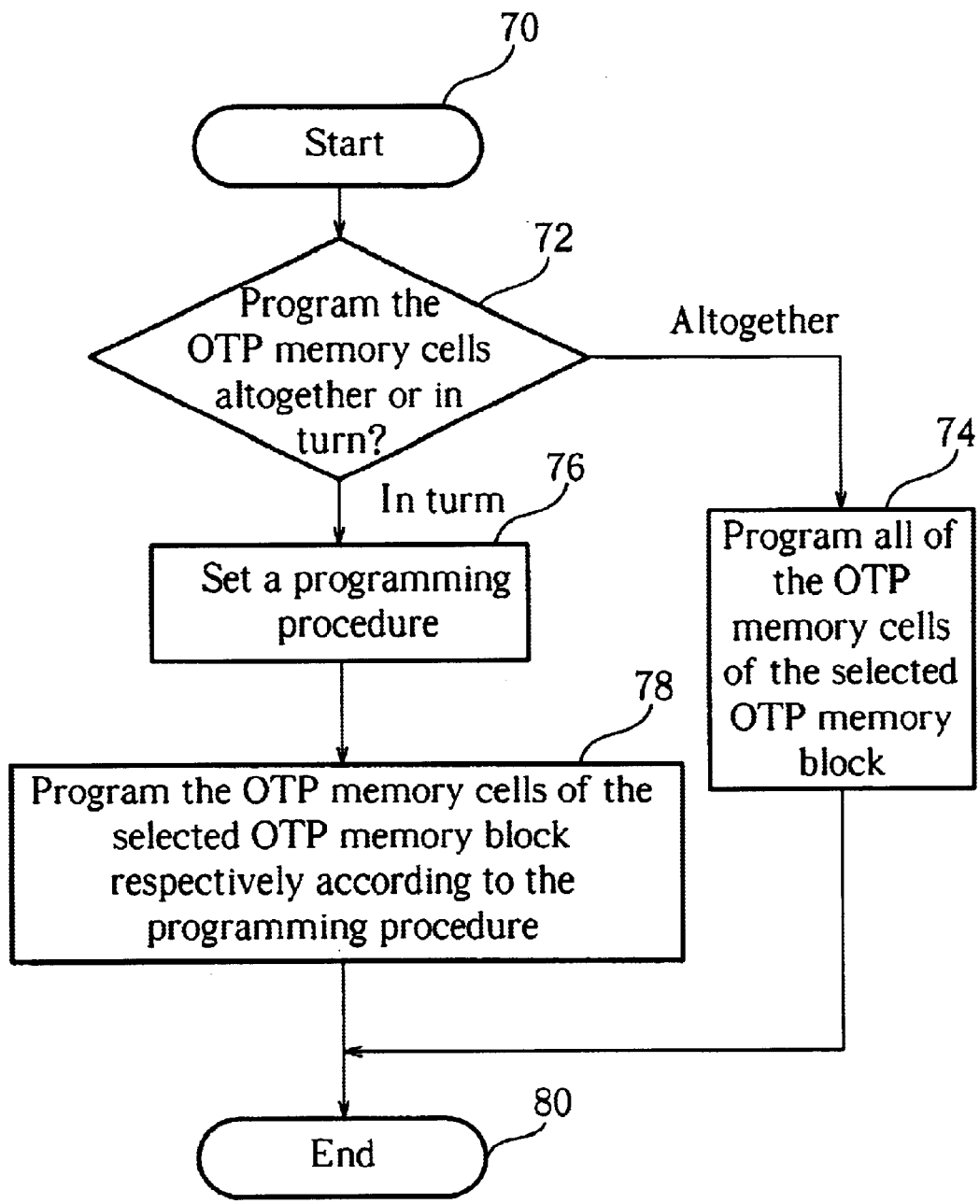
FIG. 5 is a flow chart of operations for programming the OTP memory cells of the selected OTP memory block in turn or altogether according to the present invention.

When programming the selected OTP memory block 34, the control circuit 40 can either program all the OTP memory cells 50 of the selected OTP memory block 34 or program the OTP memory cells 50 in turn. Please refer to FIG. 5, which is a flow chart of operations for programming the OTP memory cells 50 of the selected OTP memory block 34 in turn or altogether according to the present invention. When step 64 in FIG. 4 is processed, the control circuit 40 controls the operations of the memory device 30 according to the procedures shown in FIG. 5 to program all the OTP memory cells or to program a part of the OTP memory cells. The programming procedure comprises:

Step 70: start;

Step 72: determine whether to program the OTP memory cells 50 of the selected OTP memory block 34 altogether or in turn. If the OTP memory cells 50 of the selected OTP memory block 34 are programmed altogether, go to step 74. If the OTP memory cells 50 of the selected OTP memory block 34 are programmed in turn, go to step 76;

Step 74: program all of the OTP memory cells 50 of the selected OTP memory block 34 to write data to the selected OTP memory block 34. Jump to step 80;

Step 76: set a programming procedure;

Step 78: program the OTP memory cells 50 of the selected OTP memory block 34 respectively according to the programming procedure; and Step 80: end.

To describe the operations of the light source 50 in more detail, it is supposed that each of the OTP memory blocks 34 comprises 4 pages, each having 256 bits, and that the OTP memory block #2 is enabled and other OTP memory blocks 34 are disabled. In such condition, if $1^{st}-3^{rd}$ pages of the OTP memory block #2, i.e. $1^{st}-768^{th}$ bits, are programmed and data needs to be expanded, the control circuit 40 can protect the fourth page of the OTP memory block #2, i.e. $769^{th}-1024^{th}$ bits, from being programmed when programming the $1^{st}-3^{rd}$ pages. Therefore, the fourth page can be used for an expanding data purpose, and the control circuit 40 does not need to select another OTP memory block 34 to program when updating the OTP memory block #2. However, if any data stored in the $1^{st}-3^{rd}$ pages needs to be updated, the control circuit 40 will disable the OTP memory block #2 and select another un-programmed OTP memory block 34, such as the OTP memory block #3, so as to record the update data to the $1^{st}-3^{rd}$ pages of the reselected OTP memory block 34, and meanwhile, the control circuit 40 skips to program the fourth page of the reselected OTP memory block 34. Moreover, in order to record the usage condition of OTP memory blocks 34 in more detail, it is obvious that each of the record units 38 must comprise enough OTP memory cells 50 to record the status of the OTP memory blocks 34. For example, each of the record units 38 must have at least 4-bits data space to record the status of the four pages of the corresponding one OTP memory block 34, i.e. only 2-bits data space of each record unit 38 is needed if the record units 38 are updateable.

Please refer to FIG. 6, which is a flow chart of programming operations of the memory device 30 according to another embodiment of the present invention. When the programming operations of the memory device 30 is processing (step 90), the control circuit 40 selects an un-programmed OTP memory block 34 from the OTP memory blocks 34 according to the status of the OTP memory blocks 34 recorded in the record element 36 (step 92). For example, when the memory device 30 is used to store data at the first time, the control circuit 40 selects the OTP memory block #1 to program according to the status of the OTP memory block #1 recorded in the record element 36. Then, the control circuit 40 restricts programming and/or reading of unselected memory blocks in a manner previously described (step 93). Next, the control circuit 40 programs the selected OTP memory block 34 via the row decoder 42 and the column decoder 44 (step 94). After the control circuit 40 programs the selected OTP memory block 34, the control circuit 40 updates the status of the OTP memory blocks 34 by programming the record unit 38 corresponded to the selected OTP memory block 34 (step 96). For example, after the OTP memory block #1 is programmed, the corresponding record unit #A is programmed so that the data stored in the record unit #A is changed from "0" to "1". Finally, the programming procedure of t memory device 30 is terminated (step 98).

In contrast to the prior art, the present invention provides a method for controlling programming and reading operations of a plurality of OTP memory blocks to simulate updateable ability like MTP memory. Because the manufacturing processes of OTP memory are simpler than the manufacturing processes of MTP memory, the cost for updating data stored in memory according to the present invention can be decreased. Therefore, it is useful in some conditions, for example, if the user just needs to update the data stored in the OTP device five times. Moreover, any erasing circuit is unnecessary, so the circuit of the memory device can be simplified.

Those skilled in the art will readily observe that numerous modifications and alterations of the device may be made while retaining the teachings of the. Invention. Accordingly, the above disclosure should be construed as limited only by the metes and bounds of the appended claims.

What is claimed is:

1. A method for controlling operations of a memory device, the memory device comprising:
   a plurality of one-time programmable (OTP) memory blocks, each of the OTP memory blocks comprising a plurality of OTP memory cells, each of the OTP memory cells for storing one bit data;
   a record element for recording status of the OTP memory blocks; and
   a control circuit electrically connected to the OTP memory blocks for controlling programming and reading operations of the OTP memory blocks;
   the method comprising:
   (a) selecting an un-programmed OTP memory block from the OTP memory blocks according to the status of the OTP memory blocks recorded in the record element;
   (b) utilizing the control circuit to program the selected OTP memory block; and
   (c) updating the status of the OTP memory blocks recorded in the record element so as to record that the selected OTP memory block is programmed.

2. The method of claim 1 further comprising:
   (d) restricting the OTP memory blocks such that only one of the OTP memory blocks is readable at one time.

3. The method of claim 1 further comprising:
   (e) restricting the OTP memory blocks such that only one of the OTP memory blocks is programmable at one time.

4. The method of claim 1 further comprising:
   (f) restricting the OTP memory blocks from being read during programming of any one of the OTP memory blocks.

5. The method of claim 1 further comprising:
   (g) restricting the OTP memory blocks from being programmed during reading of any one of the OTP memory blocks.

6. The method of claim 1 wherein the record element comprises a plurality of record units, each of the record units corresponds to one of the OTP memory blocks for recording status of the corresponding OTP memory block, the method further comprises:
   (h) programming the record unit corresponded to the selected OTP memory block in step (c).

7. The method of claim 6 wherein the record units are composed of a plurality of OTP memory cells.

8. The method of claim 1 further comprising:
   (i) repeating steps (a), (b), and (c) until all of the OTP memory blocks are programmed.

9. The method of claim 1 further comprising:
   (j) setting a programming procedure, and programming the OTP memory cells of the selected OTP memory block respectively according to the programming procedure.

* * * * *